United States Patent
Jo et al.

(10) Patent No.: US 10,014,362 B2
(45) Date of Patent: Jul. 3, 2018

(54) DISPLAY DEVICE INCLUDING METAL LAYER AND METAL CARBIDE LAYER COVERING THE METAL LAYER

(71) Applicant: Samsung Display Co., Ltd., Yongin-si, Gyeonggi-do (KR)

(72) Inventors: Jung Yun Jo, Namyangju-si (KR); Su Bin Bae, Gyeongsan-si (KR); Jang-Kyum Kim, Osan-si (KR); Jeong Do Yang, Yongin-si (KR); Chung-Seok Lee, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/263,245

(22) Filed: Sep. 12, 2016

(65) Prior Publication Data
US 2017/0077213 A1  Mar. 16, 2017

(30) Foreign Application Priority Data
Sep. 14, 2015  (KR) .......................... 10-2015-0129683

(51) Int. Cl.
  *H01L 27/32* (2006.01)
  *H01L 51/00* (2006.01)
(52) U.S. Cl.
  CPC ...... *H01L 27/3279* (2013.01); *H01L 51/0097* (2013.01); *H01L 2251/5338* (2013.01)

(58) Field of Classification Search
  CPC . H01L 27/32; H01L 27/3276; H01L 27/3279; H01L 24/33
  See application file for complete search history.

(56) References Cited

U.S. PATENT DOCUMENTS

| | | | |
|---|---|---|---|
| 9,385,034 B2 * | 7/2016 | Chang | H01L 21/76849 |
| 2011/0048953 A1 * | 3/2011 | Kuo | C25D 7/0607 205/50 |
| 2016/0162091 A1 * | 6/2016 | Ha | G06F 1/1626 345/173 |
| 2017/0229417 A1 * | 8/2017 | Yamaguchi | H01L 24/75 |

FOREIGN PATENT DOCUMENTS

| | | |
|---|---|---|
| JP | 2008-166232 A | 7/2008 |
| KR | 10-0776480 B1 | 11/2007 |
| KR | 10-0778442 B1 | 11/2007 |
| KR | 10-1443347 B1 | 9/2014 |
| KR | 10-2014-0117340 A | 10/2014 |

* cited by examiner

*Primary Examiner* — Hoai V Pham
(74) *Attorney, Agent, or Firm* — Knobbe Martens Olson & Bear LLP

(57) ABSTRACT

A display device is disclosed. In one aspect, the display device includes a substrate including a display area and a non-display area and an input wiring portion and an output wiring portion formed in the non-display area. The display device also includes a driver integrated circuit (IC) formed over the substrate and electrically connected to the input and output wiring portions. Each of the input and output wiring portions includes a metal layer and a metal carbide layer that covers the metal layer.

16 Claims, 8 Drawing Sheets

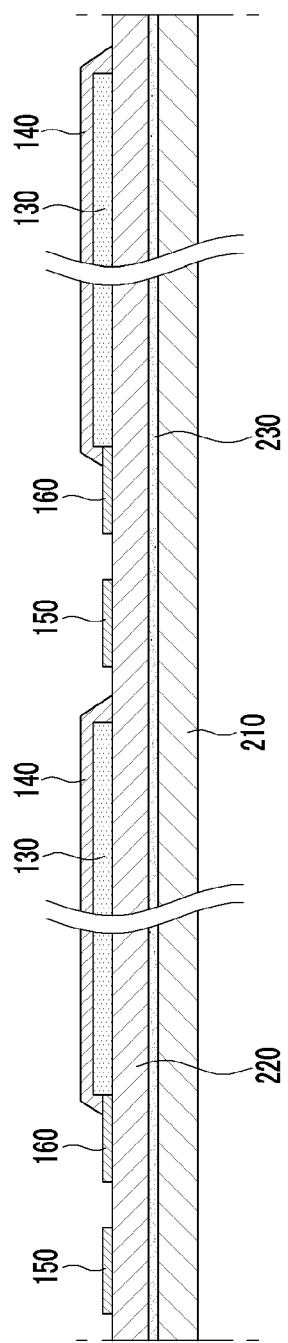

DISPLAY DEVICE INCLUDING METAL LAYER AND METAL CARBIDE LAYER COVERING THE METAL LAYER

RELATED APPLICATIONS

This application claims priority to and the benefit of Korean Patent Application No. 10-2015-0129683 filed in the Korean Intellectual Property Office on Sep. 14, 2015, the entire contents of which are incorporated herein by reference.

BACKGROUND

Field

The described technology generally relates to a display device.

Description of the Related Technology

Example types of flat panel displays include liquid crystal displays (LCDs) and organic light emitting diode (OLED) displays. They basically include a display panel, a driver integrated circuit (IC), and a printed circuit board (PCB). Display panels include signal lines, including scan lines and data lines, and thin film transistors, with a matrix of pixels connected to the signal lines.

The substrate may be a flexible substrate that is made of plastic, in which case, the display device can be bent, folded, or rolled up. The driver IC may be mounted on the substrate using a chip on plastic (COP) technique. The driver IC is connected to a printed circuit board (PCB) via an input wiring part to receive a control signal therefrom, and is connected to signal lines of a display area via an output wiring part to apply a driving voltage to the signal lines.

The above information disclosed in this Background section is only to enhance the understanding of the background of the described technology and therefore it may contain information that does not form the prior art that is already known in this country to a person of ordinary skill in the art.

SUMMARY OF CERTAIN INVENTIVE ASPECTS

One inventive aspect relates to a display device including a driver IC mounted on a substrate.

Another aspect is a display device that can suppress defects, such as deformation of the display panel and wire cracks associated with high pressure bonding, from occurring when a driver IC is mounted on a substrate.

Another aspect is a display device that includes: a substrate including a display area and a non-display area; input and output wiring parts formed in the non-display area; and a driver IC electrically coupled to the input and output wiring parts and mounted on the substrate. The input and output wiring parts respectively include a metal layer and a metal carbide layer that covers the metal layer.

The thickness of the metal carbide layer may be equal to or less than that of the metal layer. The metal carbide layer may have a thickness of more than 50 Å. The metal layer may include titanium, and the metal carbide layer may include titanium carbide.

The metal carbide layer may be deposited by sputtering, or may be formed by plasma processing a surface of the metal layer in a gas atmosphere containing carbon. The metal carbide layer may be etched together with the metal layer while the input and output wiring parts are patterned.

A plurality of thin film transistors may be formed in the display area, and the plurality of thin film transistors may respectively include source and drain electrodes. The metal layer may be formed of the same material as the source and drain electrodes. The metal layer may be formed as multiple layers with a titanium layer, an aluminum layer, and a titanium layer, and the metal carbide layer may include titanium carbide.

The substrate may be a flexible substrate that is formed of plastic, and the driver IC may be mounted on the substrate via an anisotropic conductive film. The substrate may have a structure in which one inorganic material layer is disposed between two organic material layers, and an adhesive layer and a protective film may be positioned at a back side of the substrate.

The driver IC may include an input bump unit that is electrically coupled to the input wiring part, and an output bump unit that is electrically coupled to the output wiring part. The display device may further include a flexible printed circuit board (FPCB) fixed to an edge of the substrate, electrically coupled to the input wiring part, and outputting a control signal to the driver IC.

Another aspect is a display device comprising: a substrate including a display area and a non-display area; an input wiring portion and an output wiring portion formed in the non-display area; and a driver integrated circuit (IC) formed over the substrate and electrically connected to the input and output wiring portions, wherein each of the input and output wiring portions includes a metal layer and a metal carbide layer that covers the metal layer.

In the above display device, the metal carbide layer has a thickness equal to or less than that of the metal layer. In the above display device, the metal carbide layer has a thickness greater than 50 Å. In the above display device, the metal layer includes titanium, and wherein the metal carbide layer includes titanium carbide. In the above display device, the metal carbide layer has a width the same as that of the metal layer. In the above display device, the input and output wiring portions are spaced apart from each other. The above display device further comprises a plurality of thin film transistors formed in the display area, wherein the thin film transistors respectively include source and drain electrodes, and wherein the metal layer is formed of the same material as the source and drain electrodes.

In the above display device, the metal layer comprises multiple layers of a titanium layer, an aluminum layer, and a titanium layer, and wherein the metal carbide layer includes titanium carbide. In the above display device, the substrate is a flexible substrate that is formed of plastic, and wherein the driver IC is mounted over the substrate via an anisotropic conductive film. In the above display device, the substrate has a structure in which one inorganic material layer is disposed between two organic material layers, and wherein the display device further comprises an adhesive layer and a protective film positioned at a back side of the substrate. In the above display device, the driver IC includes an input bump unit that is electrically connected to the input wiring portion, and an output bump unit that is electrically connected to the output wiring portion.

In the above display device, the input and output bump units are respectively connected to the metal carbide layers of the input and output wiring portions via a plurality of conductive particles. The above display device further comprises a flexible printed circuit board (FPCB) fixed to an edge of the substrate, electrically connected to the input wiring portion, and configured to output a control signal to the driver IC. In the above display device, a portion of the driver IC does not overlap either of the input and output wiring portions in the depth dimension of the display device.

Another aspect is a display device comprising: a substrate including a display area and a non-display area; an input wiring portion and an output wiring portion formed in the non-display area, wherein the input and output wiring portions are spaced apart from each other, and wherein each of the input and output wiring portions includes a metal layer and a metal carbide layer formed over the metal layer; and a driver integrated circuit (IC) formed over the substrate and electrically connected to the input and output wiring portions, wherein the driver IC is farther from the substrate than the input and output wiring portions.

In the above display device, the metal carbide layer is thinner than the metal layer. In the above display device, the metal layer includes titanium, and wherein the metal carbide layer includes titanium carbide. In the above display device, the metal carbide layer has a width the same as that of the metal layer.

According to at least one of the disclosed embodiments, since a native oxide layer is not formed in the input and output wiring parts, high pressure bonding for breaking the native oxide layer is not required when the driver IC is mounted. Accordingly, the display device can prevent or minimize deformation of the flexible substrate and cracking of the input and output wiring parts, which are associated with the high pressure bonding, from occurring.

BRIEF DESCRIPTION OF THE DRAWINGS

FIGS. 3A to 3D are schematic cross-sectional views illustrating a manufacturing process of a display panel including a flexible substrate.

DETAILED DESCRIPTION OF CERTAIN INVENTIVE EMBODIMENTS

Figure 1:
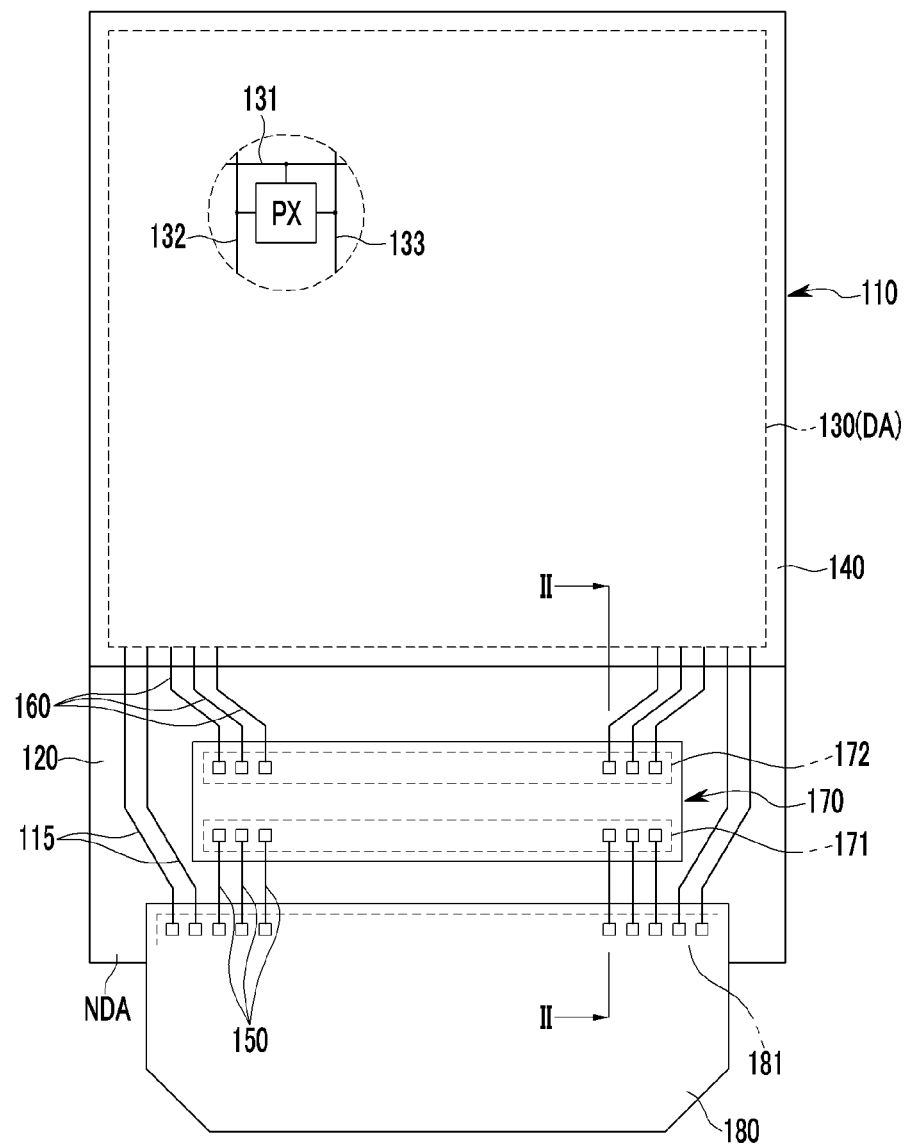
FIG. 1 is a schematic diagram of a display device according to an exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

In the drawings, the sizes and thicknesses of respective elements are arbitrarily illustrated for ease of description, and the present disclosure is not necessarily limited to such size and thickness as illustrated.

Figure 2:
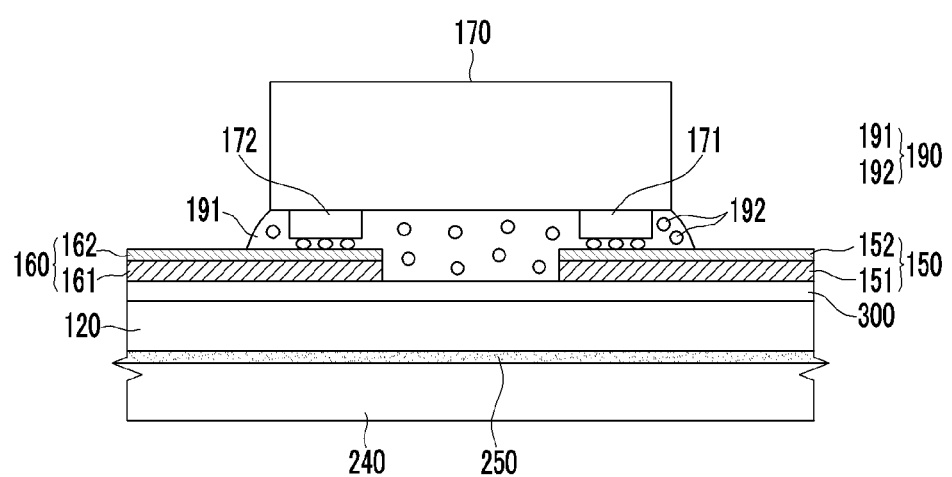
FIG. 2 is a schematic cross-sectional view of the display device of FIG. 1 taken along the line II-II.

FIG. 1 is a schematic diagram of a display device according to an exemplary embodiment, and FIG. 2 is a schematic cross-sectional view of the display device of FIG. 1 taken along the line II-II.

Referring to FIGS. 1 and 2, the display device 100 includes a display panel 110, a driver IC 170 mounted on the display panel 110, and a printed circuit board (PCB) 180 combined with the display panel 110. The display device 100 may be an organic light emitting diode (OLED) display, a liquid crystal display (LCD), or an electrophoretic display, and in the following description, the display device 100 will be exemplarily described to be an OLED display.

The display panel 110 includes a substrate 120, a display unit 130 formed on the substrate 120, and an encapsulation part or encapsulation portion 140 for encapsulating the display unit 130. The substrate 120 may be a flexible substrate that is made of plastic, and in this case, the display panel 110 may be bent, folded, or rolled up. The substrate 120 includes a display area DA in which the display unit 130 is formed, and a non-display area NDA outside the display area DA.

The display unit 130 includes a plurality of pixels PX, and displays an image by combining light emitted from the pixels PX. A plurality of signal lines, including a plurality of scan lines 131, a plurality of data lines 132, and a plurality of driving voltage lines 133, are formed in the display unit 130. Each pixel PX includes a pixel circuit connected to the signal lines, and an organic light emitting element that is controlled by the pixel circuit to emit light.

Since the organic light emitting element is very vulnerable to moisture and oxygen, the encapsulation part 140 encapsulates the display unit 130 to prevent external air from being introduced therein. The encapsulation part 140 may be made up of an encapsulation substrate bonded to the substrate 120 by a sealant, or a thin film encapsulation in which an inorganic layer and an organic layer are repeatedly laminated.

The driver IC 170 is mounted on the non-display area NDA of the substrate 120. The driver IC 170 may be a source driver IC that applies a data voltage to the display unit 130, a scan driver IC that applies a gate voltage to the display unit 130, or an integrated driver IC in which a source driver and a scan driver are integrated together. One driver IC 170 is illustrated in FIG. 1, but the number of driver integrated circuits 170 is not limited to the illustrated example.

The driver IC 170 includes an input bump unit 171 for receiving a signal from the PCB 180, and an output bump unit 172 for transmitting a signal to the display unit 130. The input bump unit 171 includes a plurality of input bumps that are arranged at one side of the driver IC 170 toward the PCB 180, while being substantially parallel to and separated from each other by a distance therebetween. The output bump unit 172 includes a plurality of output bumps that are arranged at one side of the driver IC 170 toward the display unit 130, while being parallel to and separated from each other by a distance therebetween.

An input wiring part or input wiring portion 150 is formed in the non-display area NDA of the substrate 120 to electrically couple the PCB 180, specifically, an output pad portion 181 of the PCB 180 with the input bump unit 171 of the driver IC 170. An output wiring part or output wiring portion 160 is formed in the non-display area NDA of the substrate 120 to electrically couple the output bump unit 172 of the driver IC 170 with the display unit 130. The input wiring part 150 includes a plurality of input wires, and the output wiring part 160 includes a plurality of output wires.

The driver IC 170 may be mounted on the substrate 120 using a chip on plastic (cop) technique. For example, the driver IC 170 may be mounted on the substrate 120 by ① disposing an anisotropic conductive film (ACF) 190 on the input wiring part 150 and on the output wiring part 160, ②disposing the driver IC 170 on the anisotropic conductive film 190, and ③ pressing the driver IC 170 under a high temperature using a pressing device.

The anisotropic conductive film 190 includes an adhesive resin 191, and a plurality of conductive particles 192 distributed inside the adhesive resin 191. When the driver IC 170 is pressed toward the substrate 120 while interposing the anisotropic conductive film 190 therebetween, the input bump unit 171 and the input wiring part 150 are electrically coupled by the conductive particles 192 interposed between the input bump unit 171 and the input wiring part 150. The output bump unit 172 and the output wiring part 160 are electrically coupled to each other by the conductive particles 192. The anisotropic conductive film shows conductive performance only in a vertical direction (thickness direction of the substrate).

The output pad portion 181 of the PCB 180 may also be electrically coupled to the input wiring part 150 by the anisotropic conductive film (not shown). The printed circuit board (PCB) 180 may be a flexible printed circuit (FPC), and in this case, dead space outside of the display unit 130 can be minimized by folding the flexible printed circuit toward a back side of the substrate 120.

The PCB 180 outputs a signal for controlling the driver IC 170, power, and the like, and the driver IC 170 outputs a signal for driving the display unit 130. In this case, the power outputted by the PCB 180 may be directly transmitted to the display unit 130 via a bypass wire 115, without passing through the driver IC 170.

The input and output wiring parts 150 and 160 respectively include metal layers 151 and 161, and metal carbide layers 152 and 162 that cover the metal layers 151 and 161. The metal layers 151 and 161 may be simultaneously or concurrently formed of the same material as any one of a plurality of electrodes formed in the display unit 130, and, for example, may include titanium (Ti). The metal carbide layers 152 and 162 may include the same kind of metal as the metal layers 151 and 161, and, for example, may include titanium carbide (TiC).

Right after the metal layers 151 and 161 are formed, the metal carbide layers 152 and 162 are formed on the metal layers 151 and 161 to cover the metal layers 151 and 161. Accordingly, even if the input and output wiring parts 150 and 160 are exposed to external air before mounting the driver IC 170, a native oxide layer is not formed on the metal layers 151 and 161. That is, the metal carbide layers 152 and 162 serve to prevent the native oxide layer from being formed on surfaces of the metal layers 151 and 161.

The metal carbide layers 152 and 162 may be deposited by sputtering to have a predetermined thickness on the metal layers 151 and 161, or may be formed by plasma processing the surfaces of the metal layers 151 and 161 in a gas atmosphere containing carbon. The metal carbide layers 152 and 162 are both simultaneously or concurrently etched with the metal layers 151 and 161 while the input and output wiring parts 150 and 160 are patterned. The metal carbide layers 152 and 162 are conductive layers, and contact the input and output bump units 171 and 172 of the driver IC 170.

If the metal carbide layers are not present in the input and output wiring parts 150 and 160, the metal layers 151 and 161 may react with oxygen included in the external air, and thus metal oxide layers are formed on the surfaces thereof. For example, a titanium oxide layer is formed on the surface of the metal layer including titanium. Since the metal oxide layers on the metal layers 151 and 161 are insulating layers, they increase bonding resistances between the driver IC 170 and the input wiring part 150 and between the driver IC 170 and the output wiring part 160.

Accordingly, when the driver IC 170 is mounted, high pressure should be applied to break the metal oxide layer. However, such high pressure bonding may cause defects such as deformation of the flexible substrate and cracking of the input and output wiring parts 150 and 160.

However, in the display device 100 of the current exemplary embodiment, since the native oxide layers (metal oxide layers) are not formed in the input and output wiring parts 150 and 160, high pressure bonding for breaking the native oxide layer may not be required when the driver IC 170 is mounted. Accordingly, the display device 100 of the current exemplary embodiment may prevent the deformation of the flexible substrate 120 and the cracking of the input and output wiring parts 150 and 160 associated with high pressure bonding from occurring.

FIGS. 3A to 3D are schematic cross-sectional views illustrating a manufacturing process of a display panel including a flexible substrate.

Referring to FIG. 3A, a flexible mother substrate 220 is disposed on a hard carrier substrate 210, and a display unit 130, an input wiring part 150, an output wiring part 160, and an encapsulation part 140 are formed on the flexible mother substrate 220. The carrier substrate 210 may be a transparent glass substrate, and a sacrificial layer 230 decomposed by a laser may be formed between the carrier substrate 210 and the flexible mother substrate 220.

Figure 3B:
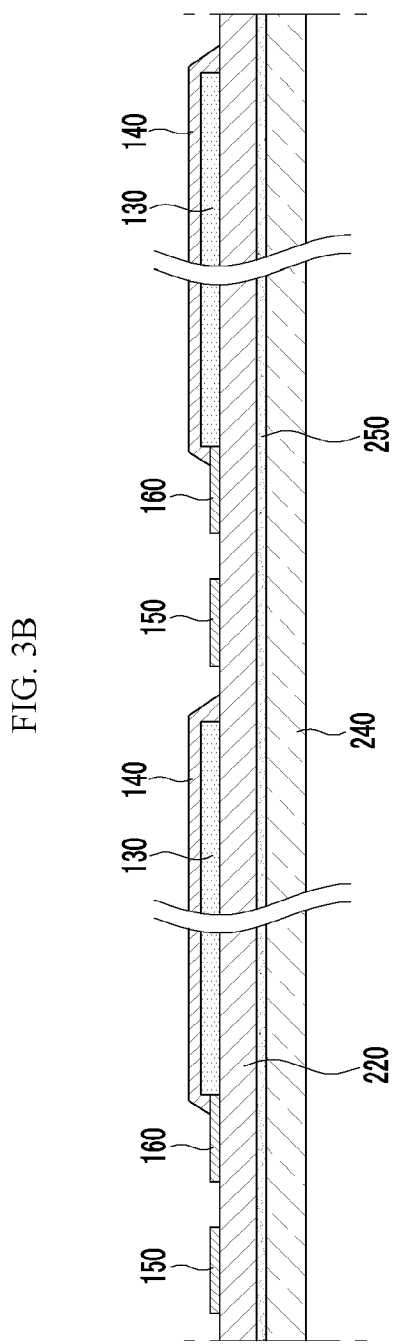

Referring to FIGS. 3A and 3B, the flexible mother substrate 220 and the carrier substrate 210 are separated, and a protective film 240 is attached to a back side of the flexible mother substrate 220. The flexible mother substrate 220 and the carrier substrate 210 may be separated from each other by irradiating the laser to the sacrificial layer 230 to remove the sacrificial layer 230. The protective film 240 may be attached to the flexible mother substrate 220 via an adhesive layer 250.

Figure 3C:
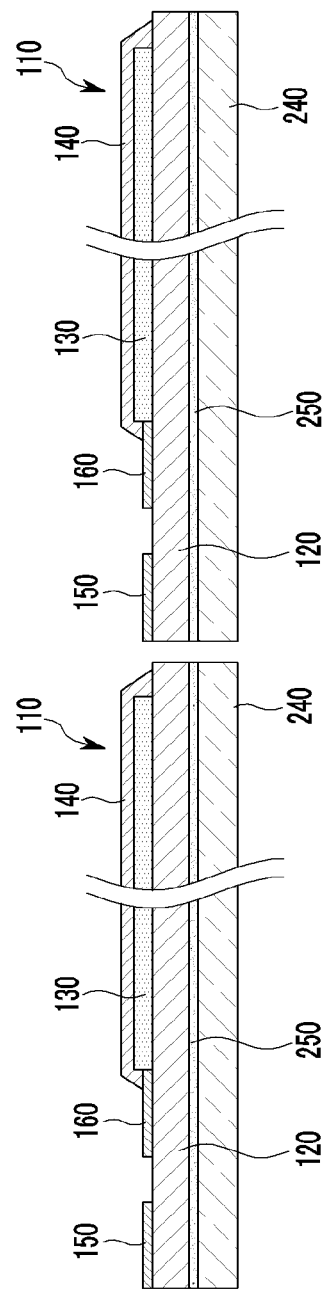

Referring to FIG. 3C, the flexible mother substrate 220 and the protective film 240 are cut by a cutting device not illustrated, and are separated into a plurality of display panels 110. In FIG. 3C, the reference numeral 120 represents a substrate.

Figure 3D:
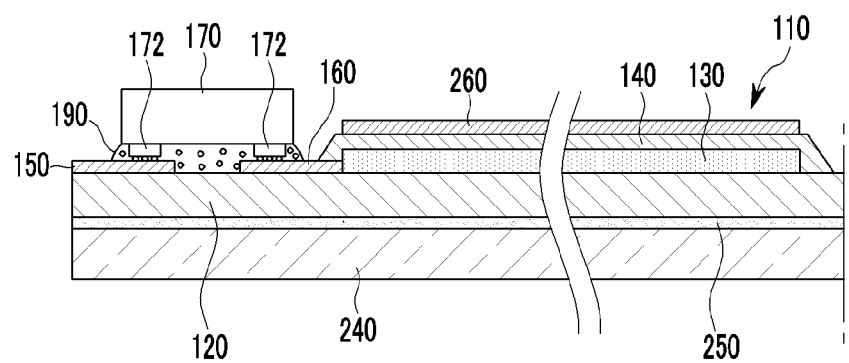

Referring to FIG. 3D, an optical film 260, such as a polarizing film, is attached to a front side of the display unit 130, and a driver IC 170 is mounted on a non-display area of the substrate 120 via an anisotropic conductive film 190. An input bump unit 171 of the driver IC 170 is electrically coupled to the input wiring part 150, while an output bump unit 172 of the driver IC 170 is electrically coupled to the output wiring part 160.

Referring back to FIGS. 1 and 2, the substrate 120 is a flexible substrate in FIG. 2, and an adhesive layer 250 and a protective film 240 are positioned at a back side of the substrate 120. An insulating layer 300 is formed between the substrate 120 and the input and output wiring parts 150 and 160. The insulating layer 300 may include a barrier layer for preventing oxygen and moisture from penetrating via the substrate 120, and a gate insulating layer and an interlayer insulating layer for insulating electrodes included in a thin film transistor from each other.

The substrate 120 may include an organic material such as polyimide, polycarbonate, ployethylene, polyethylene terephthalate, or polyacrylate, and may be formed as multiple layers including an organic material layer and an inorganic material layer. The adhesive layer 250 may include a pressure sensitive adhesive (PSA), and the protective film 240 may include an organic material such as polyethylene terephthalate or the like.

A hard glass substrate may withstand high pressure bonding of the driver IC 170, but the flexible substrate 120 and the adhesive layer 250 supported by the protective film 240 instead of the carrier substrate are vulnerable to the high pressure bonding. In the display device 100 of the current exemplary embodiment, by forming metal carbide layers 152 and 162 on metal layers 151 and 161 of the input and output wiring parts 150 and 160, the metal oxide layer can be prevented from being formed, and as a result, deformation of the substrate 120 and the adhesive layer 250 can be suppressed by decreasing the bonding pressure of the driver IC 170.

Thicknesses of the metal carbide layers 152 and 162 may be equal to or greater than about 50 Å. When the thicknesses of the metal carbide layers 152 and 162 are less than about 50 Å, the effect of suppressing the metal oxide layer may be poor. In addition, the thicknesses of the metal carbide layers 152 and 162 may be equal to or less than those of the metal layers 151 and 161. For example, when the metal layers 151 and 161 are formed to have a thickness of about 300 Å, the metal carbide layers 152 and 162 may be formed to have a thickness of about 50 Å to about 300 Å. However, depending on the embodiment, the metal carbide layers 152 and 162 may have a thickness less than about 50 Å or greater than about 300 Å.

When the thicknesses of the metal carbide layers 152 and 162 are greater than those of the metal layers 151 and 161, bonding resistances between the driver IC 170 and the input wiring part 150 and between the driver IC 170 and the output wiring part 160 may increase. Though the metal carbide layers 152 and 162 are conductive layers, since electric conductivities of the metal carbide layers 152 and 162 are lower than those of the metal layers 151 and 161, the metal carbide layers 152 and 162 are formed to be thinner than the metal layers 151 and 161, thereby decreasing bonding resistances therebetween.

In the above description, the 'metal carbide layers' have been used to describe that they are different from the metal layers 151 and 161, but the metal carbide layers 152 and 162 may be defined or expressed as a 'carbon rich region' on the surfaces of the metal layers 151 and 161.

The input and output wiring parts 150 and 160 described above may be formed of the same material as and simultaneously formed with any one of a plurality of electrodes formed in the display unit 130, for example, source and drain electrodes of the thin film transistor. For example, the source and drain electrodes and the input and output wiring parts 150 and 160 may include a triple layer of titanium/aluminum/titanium. However, the input and output wiring parts 150 and 160 include the metal carbide layers 152 and 162, while the source and drain electrodes of the display unit do not include the metal carbide layers.

Figure 4:
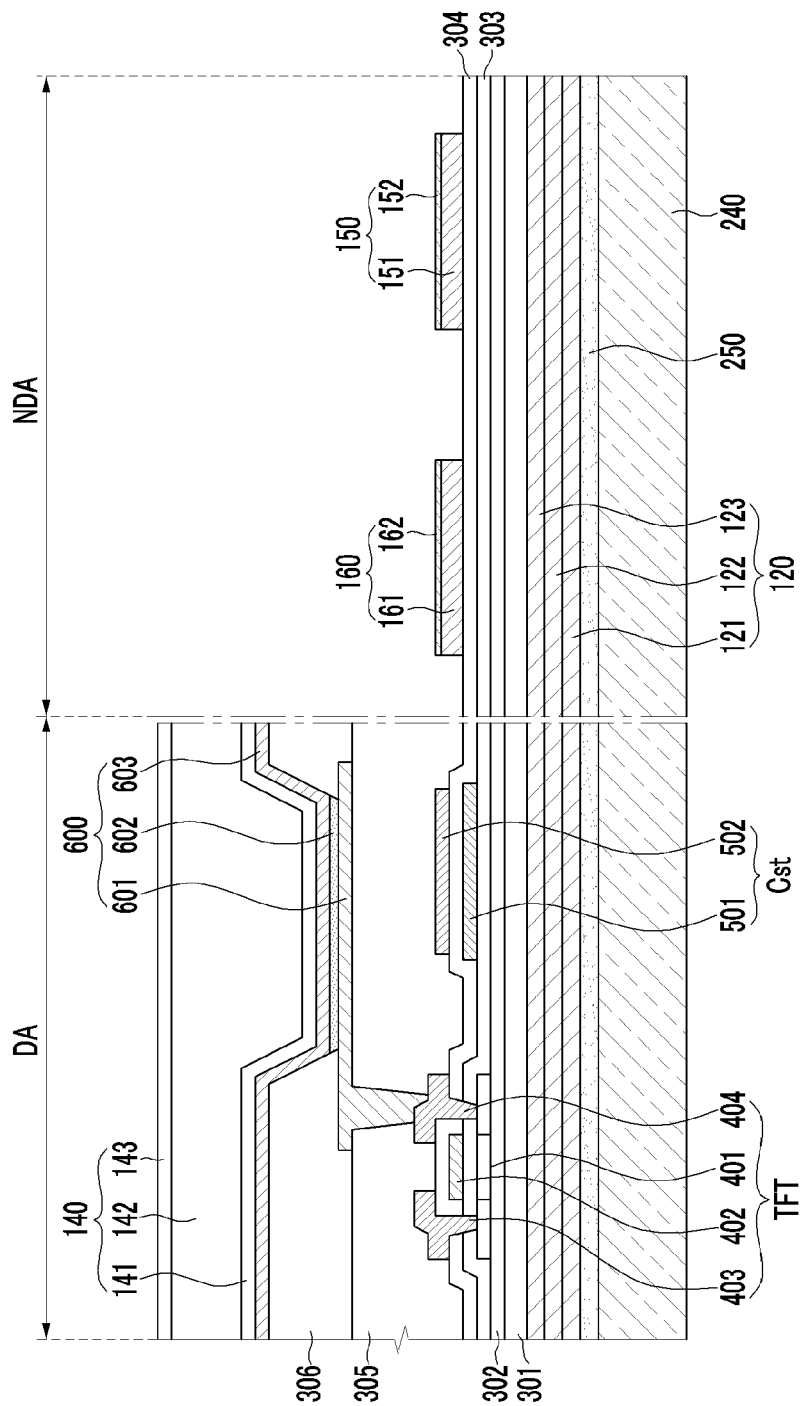
FIG. 4 is an enlarged cross-sectional view of a display unit, an input wiring part, and an output wiring part of the display device illustrated in FIG. 1.
Figure 5:
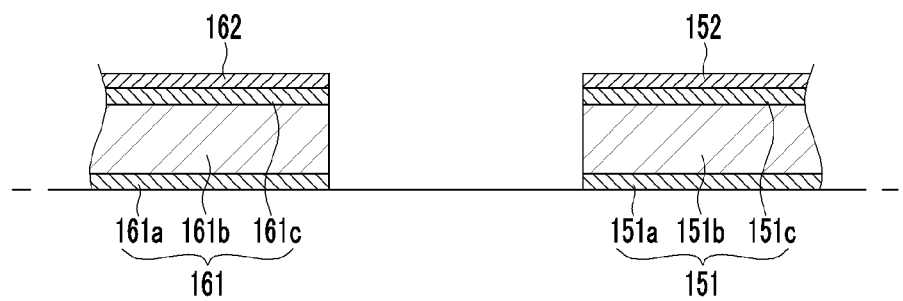
FIG. 5 is an enlarged view of the input and output wiring parts illustrated in FIG. 4.

FIG. 4 is an enlarged cross-sectional view of the display unit, the input wiring part, and the output wiring part of the display device illustrated in FIG. 1, and FIG. 5 is an enlarged view of the input and output wiring parts illustrated in FIG. 4.

Referring to FIGS. 4 and 5, a barrier layer 301 is formed on the substrate 120. The substrate 120 may be a flexible substrate, and in this case, the adhesive layer 250 and the protective film 240 are positioned at the back side of the substrate 120. The thickness of the protective film 240 can be greater than that of the substrate 120. The substrate 120 may be formed of an organic material, or may be formed to have a laminated structure of an organic material layer and an inorganic material layer.

For example, the substrate 120 may be formed to have a laminated structure of a first layer 121 formed of an organic material such as polyimide, a second layer 122 formed of an inorganic material such as a silicon oxide ($SiO_2$) or a silicon nitride (SiNx), and a third layer 123 formed of the same material as the first layer 121. The flexible substrate including the laminated structure has lower oxygen transmittance and lower moisture transmittance than a flexible substrate that is formed of only an organic material, and has high durability.

The barrier layer 301 serves to prevent penetration of moisture and oxygen via the substrate 120, and may be formed as multiple layers in which a silicon oxide ($SiO_2$) and a silicon nitride (SiNx) are alternately and repeatedly laminated. A buffer layer 302 may be formed on the barrier layer 301. The buffer layer 302 provides a smooth surface on which a pixel circuit is to be formed, and may include silicon oxide ($SiO_2$) or a silicon nitride (SiNx).

A semiconductor layer 401 is formed on the buffer layer 302. The semiconductor layer 401 may be formed of polysilicon or an oxide semiconductor, and the semiconductor layer formed of the oxide semiconductor may be covered by an additional passivation layer (not shown). The semiconductor layer 401 includes a channel region in which no impurities are doped, and source and drain regions at opposite sides of the channel region in which impurities are doped.

A gate insulating layer 303 is formed on the semiconductor layer 401. The gate insulating layer 303 may be formed of a single layer of a silicon oxide ($SiO_2$) or a silicon nitride (SiNx), or a laminated layer thereof. A gate electrode 402 and a first capacitive plate 501 are formed on the gate insulating layer 303. The gate electrode 402 overlaps the channel region of the semiconductor layer 401. The gate electrode 402 and the first capacitive plate 501 may include Au, Ag, Cu, Ni, Pt, Pd, Al, and Mo.

An interlayer insulating layer 304 is formed on the gate electrode 402 and on the first capacitive plate 501, and a source electrode 403, a drain electrode 404, and a second capacitive plate 502 are formed on the interlayer insulating layer 304. The interlayer insulating layer 304 may be formed of a single layer of a silicon oxide ($SiO_2$) or a silicon nitride (SiNx), or a laminated layer thereof.

The source and drain electrodes 403 and 404 are respectively connected to the source and drain regions of the semiconductor layer 401 via a contact hole that is formed in the interlayer insulating layer 304 and in the gate insulating layer 303. The second capacitive plate 502 overlaps the first capacitive plate 501, and the first and second capacitive plates 501 and 502 form a storage capacitor Cst, which uses the interlayer insulating layer 304 as a dielectric material. The source electrode 403, the drain electrode 404, and the second capacitive plate 502 may be formed as a metal multilayer of titanium/aluminum/titanium.

In FIG. 4, a top gate type of driving thin film transistor (TFT) has been exemplarily illustrated, but the structure of the driving thin film transistor (TFT) is not limited to the illustrated example. The pixel circuit includes a switching thin film transistor, a driving thin film transistor (TFT), and the storage capacitor Cst, and for ease of description, the switching thin film transistor is not illustrated in FIG. 4.

The input and output wiring parts 150 and 160 are formed in the non-display area NDA of the substrate 120. The input and output wiring parts 150 and 160 respectively include the metal layers 151 and 161 formed of the same material as the source and drain electrodes 403 and 404, and the metal carbide layers 152 and 162 that cover the metal layers 151 and 161.

The metal layers 151 and 161 are formed as multiple layers of titanium layers 151a and 161a, aluminum layers 151b and 161b, and titanium layers 151c and 161c, and the metal carbide layers 152 and 162 may include titanium carbide. The metal carbide layers 152 and 162 may be formed by sputtering, or may be formed by plasma processing the surfaces of the metal layers 151 and 161 in a gas atmosphere.

The driving thin film transistor (TFT) is covered by a planarization layer 305, and is connected to an organic light emitting element 600 to drive the organic light emitting element 600. The planarization layer 305 may include an organic insulator or an inorganic insulator, or may be formed as a combination of an organic insulator and an inorganic insulator. The organic light emitting element 600 includes a pixel electrode 601, an emission layer 602, and a common electrode 603.

One pixel electrode 601 is formed on the planarization layer 305 in each pixel, and is connected to the drain electrode 404 of the driving thin film transistor (TFT) via a contact hole that is formed in the planarization layer 305. A pixel defining layer (or partition wall) 306 is formed on the planarization layer 305 and on an edge of the pixel electrode 601. The emission layer 602 is formed on the pixel electrode 601, and the common electrode 603 is formed in every pixel across the entire display area DA.

Any one of the pixel electrode 601 and the common electrode 603 injects holes into the emission layer 602, while the other thereof injects electrons into the emission layer 602. The electrons and holes are combined in the emission layer 602 to generate excitons, and light is emitted by energy generated when the excitons fall from an excited state to a ground state.

The pixel electrode 601 may be formed as a reflective layer, and the common electrode 603 may be formed as a transparent layer or a transflective layer. The light emitted from the emission layer 602 is reflected from the pixel electrode 601, and is transmitted through the common electrode 603 and is then emitted to the outside. When the common electrode 603 is formed as the transflective layer, part of the light reflected from the pixel electrode 601 is reflected again from the common electrode 603, thereby forming a resonating structure to improve efficiency of extracted light.

The organic light emitting element 600 is covered by the encapsulation part 140. The encapsulation part 140 encapsulates the organic light emitting element 600, and suppresses degradation of the organic light emitting element 600 due to moisture and oxygen included in external air. The encapsulation part 140 has a laminated structure of an inorganic layer and an organic layer, and, for example, may include a first inorganic layer 141, an organic layer 142, and a second inorganic layer 143. The input and output wiring parts 150 and 160 are covered by the passivation layer (not shown) after the driver IC (not shown) is mounted.

While the inventive technology has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate including a display area and a non-display area;
   an input wiring portion and an output wiring portion formed in the non-display area; and
   a driver integrated circuit (IC) formed over the substrate and electrically connected to the input and output wiring portions,
   wherein each of the input and output wiring portions includes a metal layer and a metal carbide layer that covers the metal layer, and
   wherein the metal layer comprises multiple layers of a first titanium layer, an aluminum layer, and a second titanium layer, and wherein the metal carbide layer includes titanium carbide.

2. The display device of claim 1, wherein the metal carbide layer has a thickness equal to or less than that of the metal layer.

3. The display device of claim 2, wherein the metal carbide layer has a thickness greater than 50 Å.

4. The display device of claim 1, wherein the metal carbide layer has a width the same as that of the metal layer.

5. The display device of claim 1, wherein the input and output wiring portions are spaced apart from each other.

6. The display device of claim 1, further comprising a plurality of thin film transistors formed in the display area, wherein the thin film transistors respectively include source and drain electrodes, and wherein the metal layer is formed of the same material as the source and drain electrodes.

7. The display device of claim 1, wherein the substrate is a flexible substrate that is formed of plastic, and wherein the driver IC is mounted over the substrate via an anisotropic conductive film.

8. The display device of claim 7, wherein the driver IC includes an input bump unit that is electrically connected to the input wiring portion, and an output bump unit that is electrically connected to the output wiring portion.

9. The display device of claim 7, further comprising a flexible printed circuit board (FPCB) fixed to an edge of the substrate, electrically connected to the input wiring portion, and configured to output a control signal to the driver IC.

10. The display device of claim 1, wherein a portion of the driver IC does not overlap either of the input and output wiring portions in the depth dimension of the display device.

11. A display device comprising:
    a substrate including a display area and a non-display area;
    an input wiring portion and an output wiring portion formed in the non-display area; and
    a driver integrated circuit (IC) formed over the substrate and electrically connected to the input and output wiring portions,
    wherein each of the input and output wiring portions includes a metal layer and a metal carbide layer that covers the metal layer,
    wherein the substrate has a structure in which one inorganic material layer is disposed between two organic material layers, and wherein the display device further comprises an adhesive layer and a protective film positioned at a back side of the substrate.

12. The display device of claim 8, wherein the input and output bump units are respectively connected to the metal carbide layers of the input and output wiring portions via a plurality of conductive particles.

13. A display device comprising:
    a substrate including a display area and a non-display area;

an input wiring portion and an output wiring portion formed in the non-display area, wherein the input and output wiring portions are spaced apart from each other, and wherein each of the input and output wiring portions includes a metal layer and a metal carbide layer formed over the metal layer; and a driver integrated circuit (IC) formed over the substrate and electrically connected to the input and output wiring portions, wherein the driver IC is farther from the substrate than the input and output wiring portions, wherein the substrate has a structure in which one inorganic material layer is disposed between two organic material layers, and wherein the display device further comprises an adhesive layer and a protective film positioned at a back side of the substrate.

14. The display device of claim 13, wherein the metal carbide layer is thinner than the metal layer.

15. The display device of claim 13, wherein the metal layer includes titanium, and wherein the metal carbide layer includes titanium carbide.

16. The display device of claim 13, wherein the metal carbide layer has a width the same as that of the metal layer.

* * * * *